(12) United States Patent
Yahashi

(10) Patent No.: US 8,273,628 B2
(45) Date of Patent: Sep. 25, 2012

(54) SEMICONDUCTOR DEVICE MANUFACTURING METHOD INCLUDING EXPOSING ELECTRODE LAYERS INTO A HOLE

(75) Inventor: Katsunori Yahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 333 days.

(21) Appl. No.: 12/718,641

(22) Filed: Mar. 5, 2010

(65) Prior Publication Data

US 2011/0049607 A1    Mar. 3, 2011

(30) Foreign Application Priority Data

Aug. 25, 2009  (JP) ................................. 2009-194028

(51) Int. Cl.
*H01L 21/336* (2006.01)
(52) U.S. Cl. ................................. 438/288; 257/E21.679
(58) Field of Classification Search .................. 438/288; 257/E21.679, E21.693
See application file for complete search history.

(56) References Cited

U.S. PATENT DOCUMENTS 6,313,572 B1 * 11/2001 Yamada ........................ 313/310
2009/0283819 A1    11/2009 Ishikawa et al.

FOREIGN PATENT DOCUMENTS

JP    2007-266143    10/2007

OTHER PUBLICATIONS

Ishikawa et al., U.S. Appl. No. 12/818,005, filed Jun. 17, 2010.
Tanaka et al.; "Bit Cost Scalable Technology with Punch and Plug Process for Ultra High Density Flash Memory", Symp. on VLSI Tech. Dig., pp. 14-15, (2007).

* cited by examiner

*Primary Examiner* — Matthew Landau
*Assistant Examiner* — Daniel Luke
(74) *Attorney, Agent, or Firm* — Finnegan, Henderson, Farabow, Garrett & Dunner, L.L.P.

(57) ABSTRACT

A semiconductor device manufacturing method includes: alternately stacking a plurality of insulating layers and electrode layers; forming a hole penetrating through a multilayer body of the insulating layers and the electrode layers; forming a conductive film on an inner wall of the hole; anisotropically etching the conductive film to selectively leave the conductive film on a sidewall of the hole; altering the conductive film into an insulator by heat treatment; and removing the insulator covering the electrode layers to expose the electrode layers into the hole.

15 Claims, 8 Drawing Sheets

SEMICONDUCTOR DEVICE MANUFACTURING METHOD INCLUDING EXPOSING ELECTRODE LAYERS INTO A HOLE

CROSS-REFERENCE TO RELATED APPLICATIONS

This application is based upon and claims the benefit of priority from the prior Japanese Patent Application No. 2009-194028, filed on Aug. 25, 2009; the entire contents of which are incorporated herein by reference.

BACKGROUND OF THE INVENTION

This invention relates to a semiconductor device manufacturing method and a semiconductor device.

A technique for three-dimensionally arranging memory cells is proposed in, for instance, JP-A-2007-266143 (Kokai). In this technique, a plurality of electrode layers functioning as control gates in a memory device are stacked alternately with insulating layers to form a multilayer body. Memory holes are formed therein, and a charge storage layer is formed on the inner wall of the memory hole. Then, silicon is provided in the memory hole.

This results in a structure in which the electrode layers cover the pillar-shaped silicon at a prescribed pitch, and a memory cell is formed at each intersection between the electrode layer and the silicon pillar. The memory hole is formed through the multilayer body of a plurality of electrode layers and a plurality of insulating layers. Here, as the number of stacked layers increases and the aspect ratio of the memory hole becomes higher, the sidewall of the memory hole is tapered, and the hole diameter tends to decrease toward the bottom of the memory hole. Variation in the hole diameter along the depth of the memory hole may lead to variation in the characteristics of memory cells between the upper-layer side and the lower-layer side.

SUMMARY OF THE INVENTION

According to an aspect of the invention, there is provided a semiconductor device manufacturing method including: alternately stacking a plurality of insulating layers and electrode layers; forming a hole penetrating through a multilayer body of the insulating layers and the electrode layers; forming a conductive film on an inner wall of the hole; anisotropically etching the conductive film to selectively leave the conductive film on a sidewall of the hole; altering the conductive film into an insulator by heat treatment; and removing the insulator covering the electrode layers to expose the electrode layers into the hole.

According to another aspect of the invention, there is provided a semiconductor device manufacturing method including: forming a recess in a conductive layer; burying a sacrificial film in the recess; alternately stacking a plurality of insulating layers and electrode layers on the conductive layer having the sacrificial film buried therein; forming a hole penetrating through a multilayer body of the insulating layers and the electrode layers; forming a conductive film on an inner wall of the hole; anisotropically etching the conductive film to selectively leave the conductive film on a sidewall of the hole; altering the conductive film into an insulator by heat treatment; removing the insulator covering the electrode layers to expose the electrode layers into the hole; and removing the sacrificial film in the recess through the hole to connect the hole exposing the electrode layers to the recess.

According to still another aspect of the invention, there is provided a semiconductor device including: a multilayer body with a plurality of insulating layers and a plurality of electrode layers alternately stacked therein; a semiconductor layer provided in a memory hole penetrating through the multilayer body; and an insulating film including a charge storage layer provided between the electrode layers and the semiconductor layer, hole diameters of portions of the memory hole surrounded by each of the electrode layers being generally equal, and portions of the electrode layers opposed to the memory hole being projected toward the center of the memory hole from portions of the insulating layers opposed to the memory hole.

DETAILED DESCRIPTION

Embodiments of the invention will now be described with reference to the drawings. Although the semiconductor is illustratively silicon in the following embodiments, semiconductors other than silicon may also be used.

Figure 1:
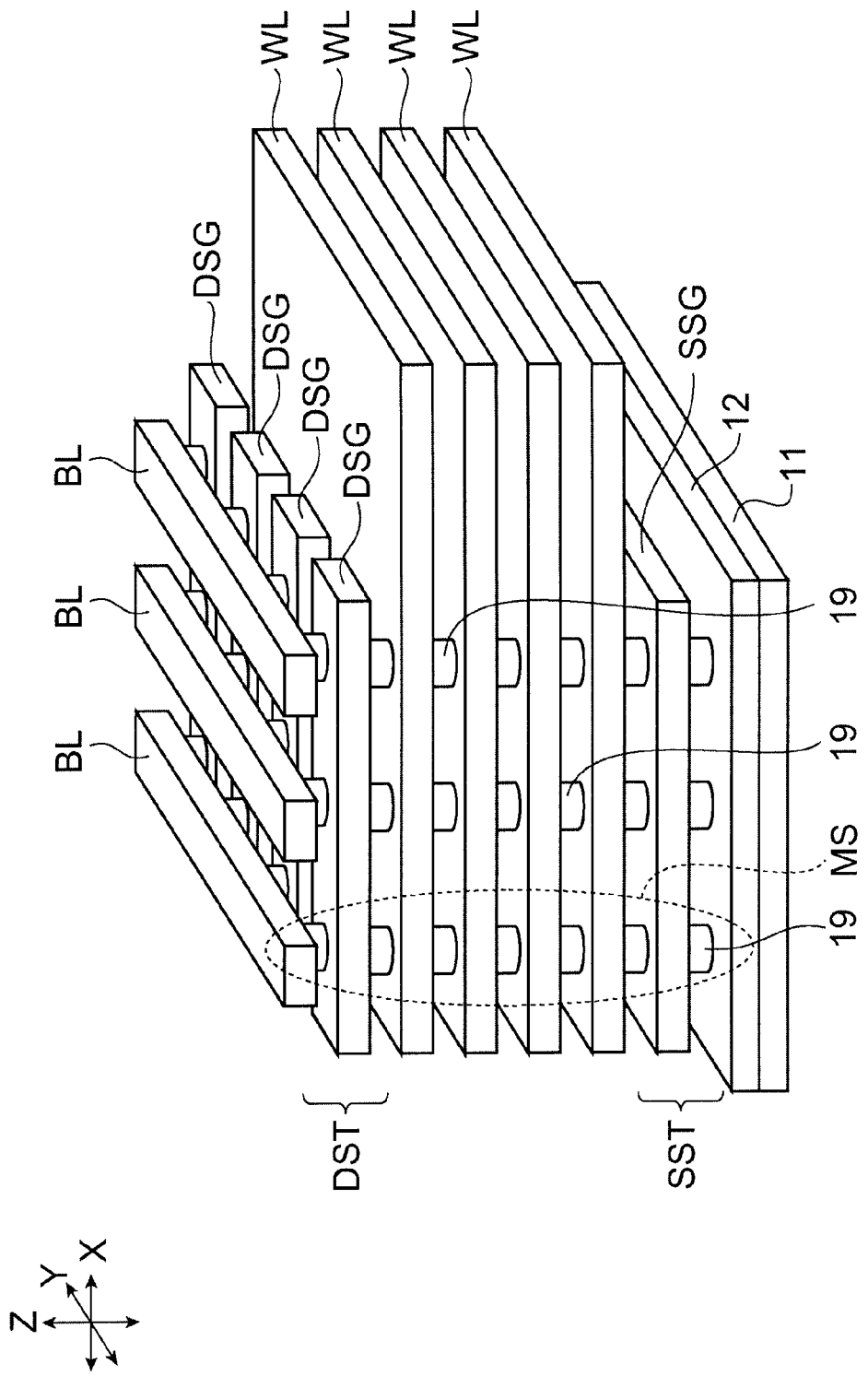
FIG. 1 is a schematic perspective view of a semiconductor device according to an embodiment of the invention.

The semiconductor device according to the embodiments of the invention includes a memory cell array in which a plurality of memory cells are arranged in three dimensions. FIG. 1 is a schematic perspective view illustrating the configuration of the memory cell array.

For clarity of illustration, FIG. 1 shows only the conductive portions, and omits the insulating portions. Furthermore, in FIG. 1, for convenience of description, an XYZ orthogonal coordinate system is introduced. In this coordinate system, the two directions parallel to the major surface of the substrate 11 and orthogonal to each other are referred to as the X and Y direction, and the direction orthogonal to both the X and Y direction, or the stacking direction of a plurality of electrode layers WL, is referred to as the Z direction.

A source layer 12 is provided on the substrate (such as silicon substrate) 11. A source-side select gate (or lower select gate) SSG is provided on the source layer 12 via an insulating layer. The source layer 12 and the source-side select gate SSG are illustratively silicon layers provided with conductivity by impurity doping.

An insulating layer is provided on the source-side select gate SSG, and on that insulating layer is provided a multilayer body in which a plurality of electrode layers WL and a plurality of insulating layers are alternately stacked. The number of electrode layers WL is arbitrary, and the case of four layers is illustrated in FIG. 1. The electrode layer WL is illustratively a silicon layer provided with conductivity by impurity doping.

An insulating layer is provided on the uppermost electrode layer WL, and drain-side select gates (upper select gates) DSG are provided on that insulating layer. The drain-side select gate DSG is illustratively a silicon layer provided with conductivity by impurity doping.

The electrode layer WL, the source-side select gate SSG, and the source layer 12 are formed as plate-shaped layers generally parallel to the XY plane. The drain-side select gates DSG are a plurality of wiring-shaped conductive members extending in the X direction.

A plurality of memory holes extending in the Z direction are formed in the aforementioned multilayer body on the substrate 11. These memory holes are arranged in a matrix layout illustratively in the X and Y direction. A silicon body 19 is buried as a pillar-shaped semiconductor layer inside each memory hole. The silicon body 19 penetrates through the drain-side select gate DSG, the electrode layers WL, and the source-side select gate SSG. The lower end of the silicon body 19 is connected to the source layer 12.

An insulating layer is provided on the drain-side select gate DSG, and on that insulating layer is provided a plurality of bit lines extending in the Y direction. Each bit line BL is arranged so as to pass immediately above a sequence of silicon bodies 19 arranged along the Y direction, and is connected to the upper end of the silicon bodies 19.

As many memory cells as the electrode layers WL are series connected in the Z direction around one silicon body 19 to constitute one memory string MS. Such memory strings MS are arranged in a matrix layout in the X and Y direction, and thereby a plurality of memory cells MC are three-dimensionally arranged in the X, Y, and Z direction.

Figure 2:
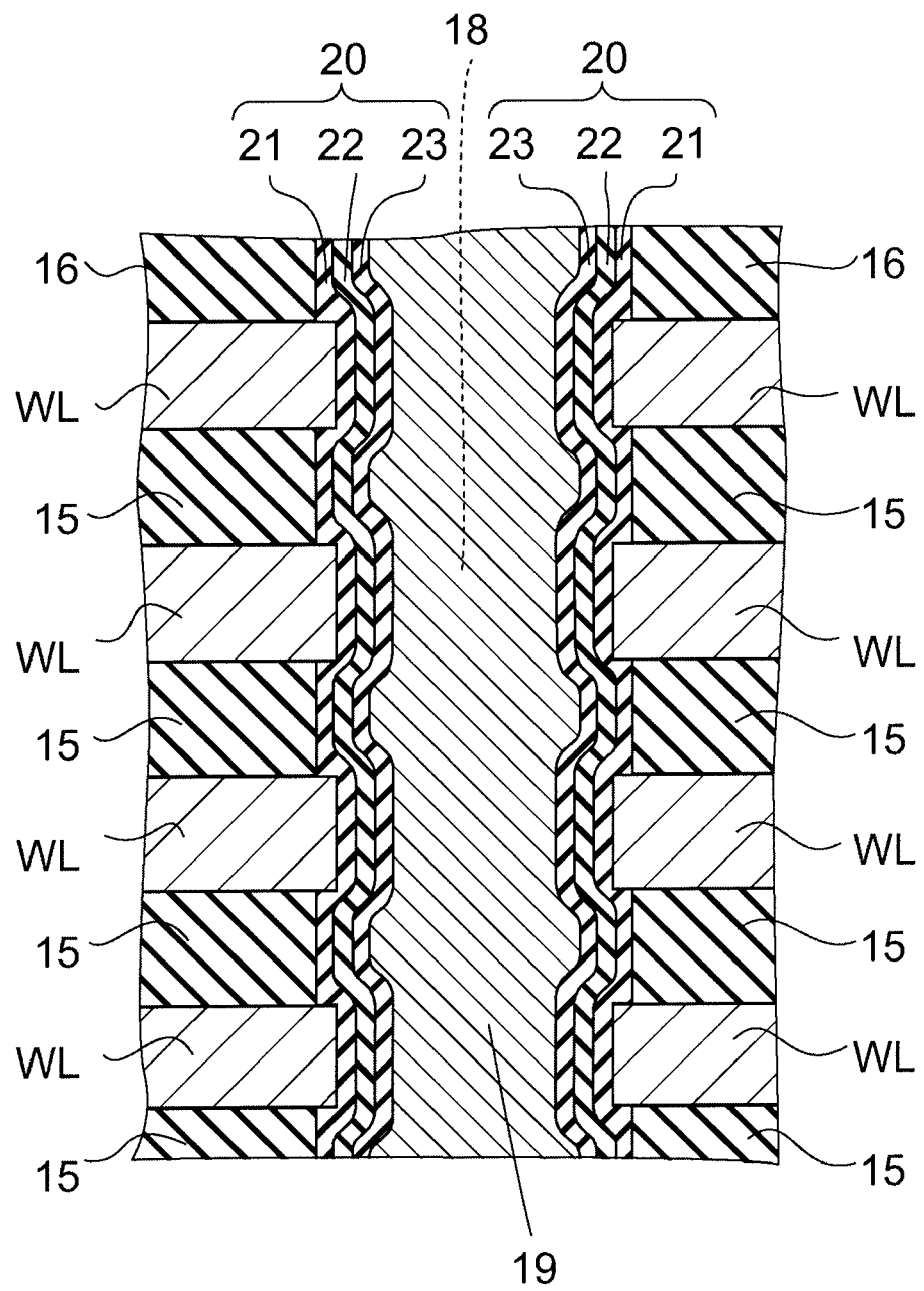
FIG. 2 is a schematic enlarged cross sectional view of the relevant part in FIG. 1.

FIG. 2 is an enlarged cross-sectional view of the portion including memory cells.

An insulating layer 15 illustratively containing silicon oxide is provided between each adjacent pair of electrode layers WL. An insulating layer 16 illustratively containing silicon nitride is provided on the uppermost electrode layer WL. On the sidewall of the memory hole 18 formed in the multilayer body of these layers is formed an insulating film 20 illustratively having an ONO (oxide-nitride-oxide) structure in which a silicon nitride film is sandwiched between a pair of silicon oxide films.

The insulating film 20 has a structure in which a charge storage layer 22 is sandwiched between a first insulating film 21 and a second insulating film 23. The silicon body 19 is provided inside the second insulating film 23, which is in contact with the silicon body 19. The first insulating film 21 is provided in contact with the electrode layer WL, and the charge storage layer 22 is provided between the first insulating film 21 and the second insulating film 23.

The silicon body 19 functions as a channel, each electrode layer WL functions as a control gate, and the charge storage layer 22 functions as a data storage layer for storing charge injected from the silicon body 19. That is, at each intersection between the silicon body 19 and the electrode layer WL is formed a memory cell having a structure in which the control gate surrounds the channel.

The memory cell is one having a charge trap structure. The charge storage layer 22 includes numerous traps for confining charges (electrons), and is illustratively made of silicon nitride film. The second insulating film 23 is illustratively made of silicon oxide film, and serves as a potential barrier when charge is injected from the silicon body 19 into the charge storage layer 22, or when the charge stored in the charge storage layer 22 diffuses into the silicon body 19. The first insulating film 21 is illustratively made of silicon oxide film, and prevents the charge stored in the charge storage layer 22 from diffusing into the electrode layer WL.

Referring again to FIG. 1, a gate insulating film, not shown, is tubularly formed on the inner peripheral wall of the hole formed in the multilayer body composed of the source-side select gate SSG and its overlying and underlying insulating layer, and the silicon body 19 is provided inside the gate insulating film. Thus, a source-side select transistor SST is implemented in which the source-side select gate SSG serves as a gate electrode, and the silicon body 19 provided therein via the gate insulating film serves as a channel.

Furthermore, a gate insulating film, not shown, is tubularly formed on the inner peripheral wall of the hole formed in the multilayer body composed of the drain-side select gate DSG and its overlying and underlying insulating layer, and the silicon body 19 is provided inside the gate insulating film. Thus, a drain-side select transistor DST is implemented in which the drain-side select gate DSG serves as a gate electrode, and the silicon body 19 provided therein via the gate insulating film serves as a channel.

Around the memory cell array described above, a peripheral circuit, not shown, is formed in the same substrate 11. The peripheral circuit illustratively includes a driver circuit for applying a potential to the upper end portion of the silicon body 19 through the bit line BL, a driver circuit for applying a potential to the lower end portion of the silicon body 19 through the source line 12, a driver circuit for applying a potential to the drain-side select gate DSG, a driver circuit for applying a potential to the source-side select gate SSG, and a driver circuit for applying a potential to each electrode layer WL.

The semiconductor device according to this embodiment is a nonvolatile semiconductor memory device in which electrical erasure/writing of data can be freely performed, and the stored content can be retained even after power off.

The X coordinate of a memory cell is selected by selecting a bit line BL. The Y coordinate of the memory cell is selected by selecting a drain-side select gate DSG to turn the drain-side select transistor DST into the conducting or non-conducting state. The Z coordinate of the memory cell is selected by selecting an electrode layer WL. Then, data is stored by injecting electrons into the charge storage layer 22 of the selected memory cell. The data stored in that memory cell is read by passing a sense current in the silicon body 19 passing through that memory cell.

Next, a semiconductor device manufacturing method according to this embodiment is described with reference to FIGS. 3 to 7.

Figure 3A:
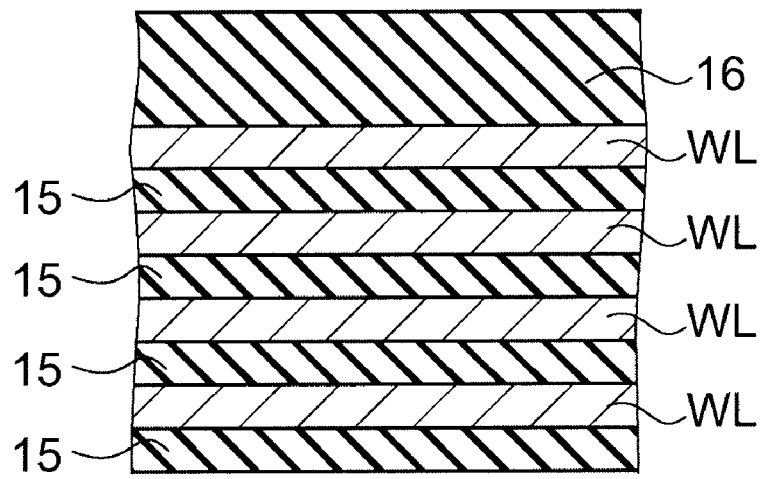
FIGS. 3A to 7B are schematic views illustrating a semiconductor device manufacturing method according to this embodiment of the invention.

After a source layer 12, a source-side select gate SSG and the like are formed on a substrate 11, as shown in FIG. 3A, a plurality of insulating layers 15 and electrode layers WL are alternately stacked on the source-side select gate SSG. Furthermore, an insulating layer 16 is stacked on the uppermost electrode layer WL.

The electrode layer WL is illustratively a polycrystalline silicon layer. The electrode layer WL and the insulating layers 15, 16 are formed illustratively by the CVD (chemical vapor deposition) process. Alternatively, the electrode layer WL may be made of such materials as tungsten silicide (WSi), nickel silicide (NiSi), cobalt silicide (CoSi), titanium silicide (TiSi), tungsten (W), aluminum (Al), titanium (Ti), titanium nitride (TiN), tantalum (Ta), tantalum nitride (TaN), and ruthenium (Ru).

The insulating layers 15, 16 can be made of such materials as silicon oxide, silicon nitride, and alumina. In this embodiment, for instance, the insulating layer 15 is a silicon oxide layer, and the insulating layer 16 is a silicon nitride layer.

Figure 3B:
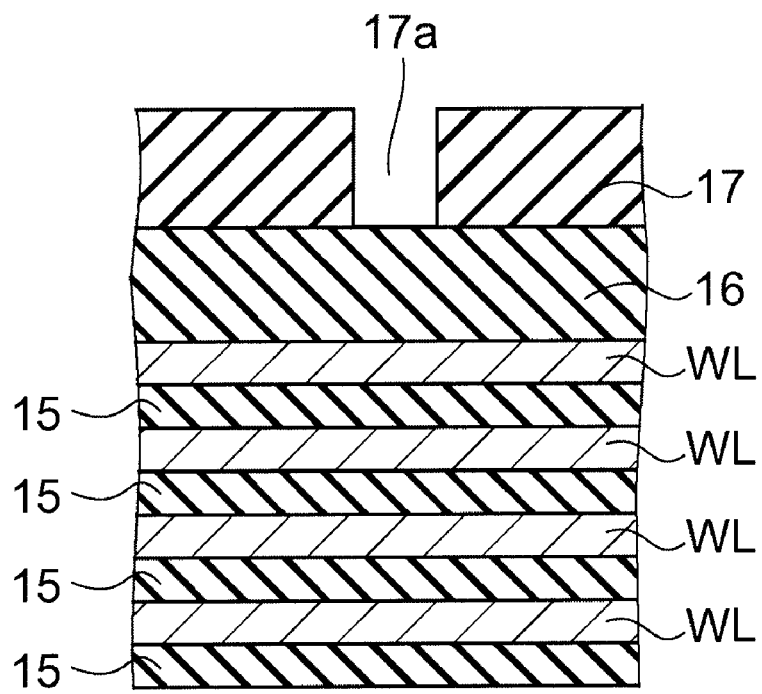
Figure 4A:
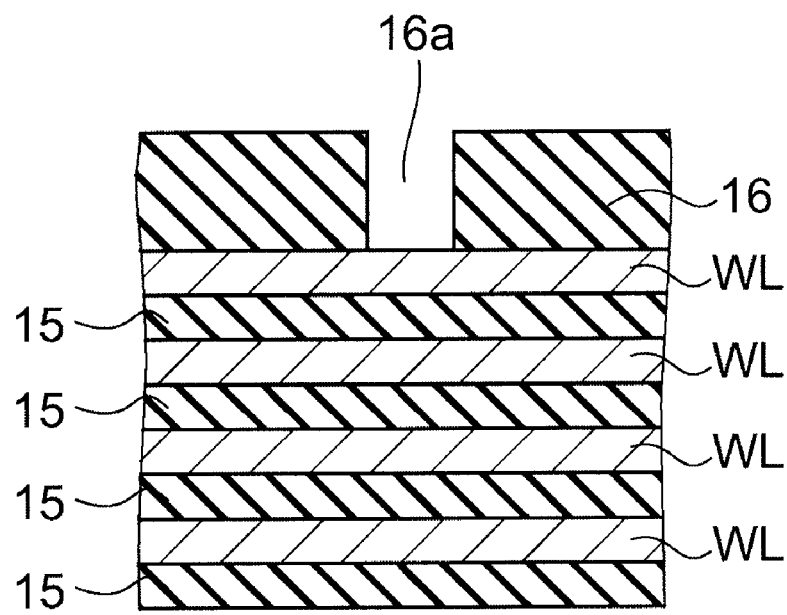

Next, as shown in FIG. 3B, a resist film 17 is formed on the insulating layer 16 and then patterned, and an opening 17a is formed in the resist film 17. Then, this resist film 17 is used as a mask to perform RIE (reactive ion etching) to form a hole 16a in the insulating layer 16 as shown in FIG. 4A. Then, the resist film 17 is removed.

Figure 4B:
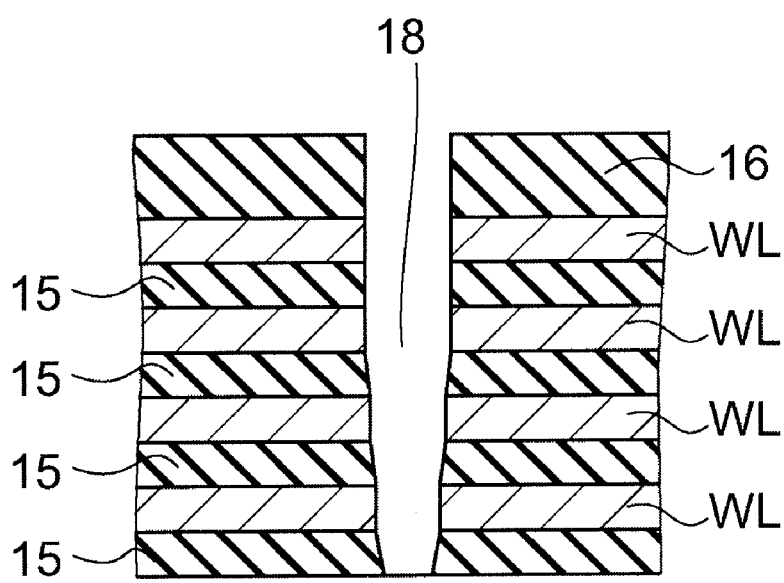

Subsequently, the insulating layer 16 is used as a mask to perform RIE to form a memory hole 18 penetrating through the multilayer body of the insulating layers 15 and the electrode layers WL as shown in FIG. 4B. Here, the sidewall of each layer constituting the sidewall of the memory hole 18, particularly the sidewall of lower insulating layers 15, tends to be sloped like an inverted truncated cone. That is, a hole diameter of the memory hole 18 is not constant along the depth, but tends to narrow downward. This becomes more prominent as the aspect ratio of the memory hole 18 becomes higher with the increase in the number of stacked electrode layers WL and insulating layers 15 for the purpose of increasing memory capacity.

Due to variation in the hole diameter along the depth of the memory hole 18, the circumferential length of the channel surrounded by the electrode layer WL is varied between the upper-layer side and the lower-layer side, which may lead to variation in the characteristics of memory cells among the layers. Hence, it is desired that the hole diameter of the memory hole 18 be constant along the depth.

Figure 5A:
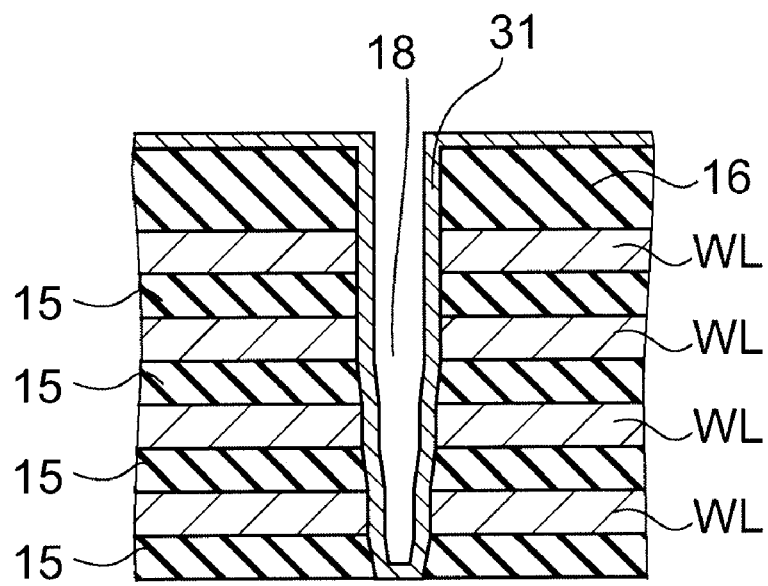

Thus, in this embodiment, the process of FIG. 4B is followed by the processes described below. First, as shown in FIG. 5A, a conductive film 31 is formed on the inner wall of the memory hole 18 including its sidewall and bottom. The conductive film 31 is made of the same material, illustratively a silicon film, as the electrode layer WL. The conductive film 31 is formed illustratively by the CVD process.

Figure 5B:
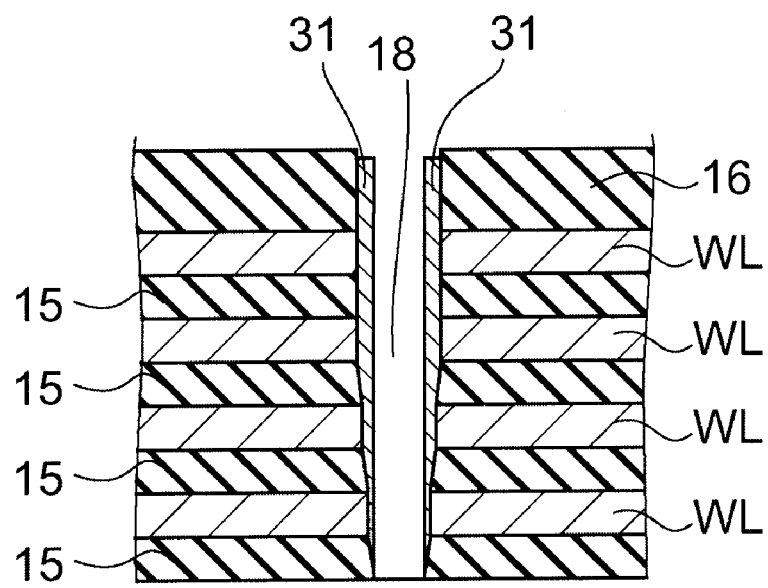

Next, anisotropic etching is performed on the conductive film 31. Specifically, RIE is performed so that etching proceeds in the vertical direction generally perpendicular to the major surface of the substrate. Thus, as shown in FIG. 5B, the conductive film 31 above the insulating layer 16 and the conductive film 31 at the bottom of the memory hole 18 are removed, and the conductive film 31 is selectively left on the sidewall of the memory hole 18.

Here, because etching proceeds in the vertical direction generally perpendicular to the major surface of the substrate, the side surface of the conductive film 31 on the upper-layer side, which is generally parallel to the etching direction, is not significantly etched, but the side surface generally perpendicular to the major surface of the substrate is maintained.

In contrast, the side surface of the conductive film 31 formed on the sloped sidewall particularly on the lower portion of the memory hole 18 is sloped with respect to the etching direction, and hence the amount of etching is relatively larger. Thus, the thickness of the conductive film 31 on the lower portion of the memory hole 18 becomes thinner than that of the conductive film 31 on the upper portion. Furthermore, vertical etching rectifies the slope of the side surface of the conductive film 31 into a side surface generally perpendicular to the major surface of the substrate.

This consequently reduces the variation in the hole diameter along the depth of the memory hole 18 inside the conductive film 31, resulting in the memory hole 18 with the hole diameter nearly constant along the depth. However, if the conductive film 31 is left behind on the sidewall, the electrode layers WL are short-circuited to each other through the conductive film 31.

Figure 6A:
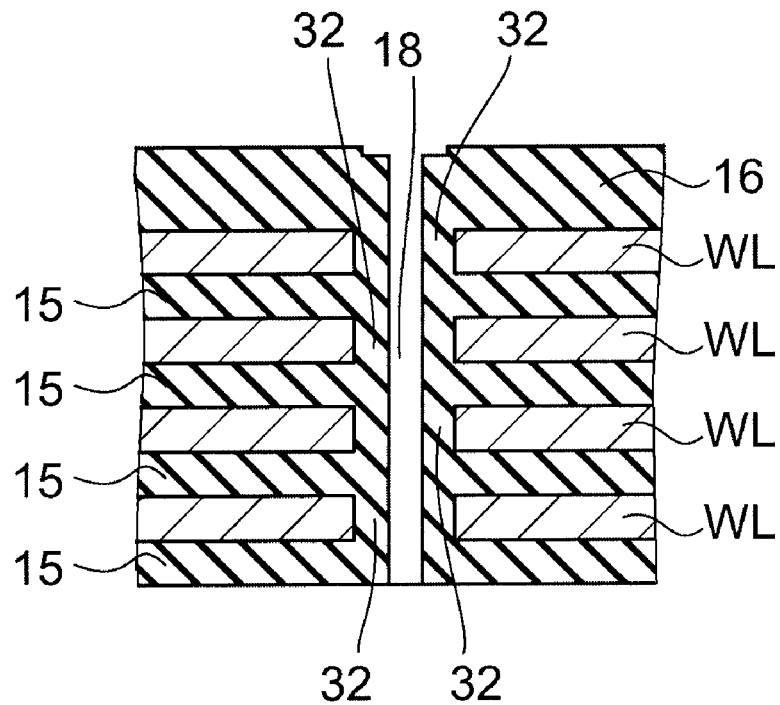

Thus, heat treatment is subsequently performed to alter the conductive film 31 into an insulator as shown in FIG. 6A. Specifically, heat treatment is performed in an oxygen-containing atmosphere so that the conductive film 31 made of silicon is thermally oxidized and altered into silicon oxide.

By this thermal oxidation, the conductive film 31 itself turns into silicon oxide. Simultaneously, oxidation growth proceeds also toward the center (radial center) of the memory hole 18, resulting in a thermally oxidized portion 32 with the volume expanded relative to the original conductive film 31.

In the portion of the conductive film 31 opposed to the electrode layer WL, oxidation growth proceeds also toward the electrode layer WL. In the state before thermal oxidation shown in FIG. 5B, the spacing between the opposed side surfaces of the conductive film 31 opposed to the electrode layer WL (the hole diameter of the memory hole 18 inside that conductive film 31) is nearly constant among the layers. Furthermore, the electrode layer WL and the conductive film 31 are made of the same material. Thus, in the portion opposed to the electrode layer WL, the amount of oxidation growth from the memory hole 18 side to the electrode layer WL side can be made nearly equal among the layers. Hence, as shown in FIG. 6A, the spacing between the end surfaces of the electrode layer WL opposed to the memory hole 18 can be generally equalized among the layers.

It is noted that the electrode layer WL and the conductive film 31 are not limited to the same material, but may be made of different materials. In this case, if there is a large difference in oxidation rate between the conductive film 31 and the electrode layer WL, the end surface position of the electrode layer WL around the memory hole 18 may vary among the layers. Hence, the combination of the conductive film 31 and the electrode layer WL is desirably such that the difference in oxidation rate therebetween is minimized. If the conductive film 31 and the electrode layer WL are made of the same material, the oxidation rate of the conductive film 31 can be made nearly equal to that of the electrode layer WL, and the spacing between the opposed end surfaces of the electrode layer WL around the memory hole 18 can be easily equalized among the layers.

Figure 6B:
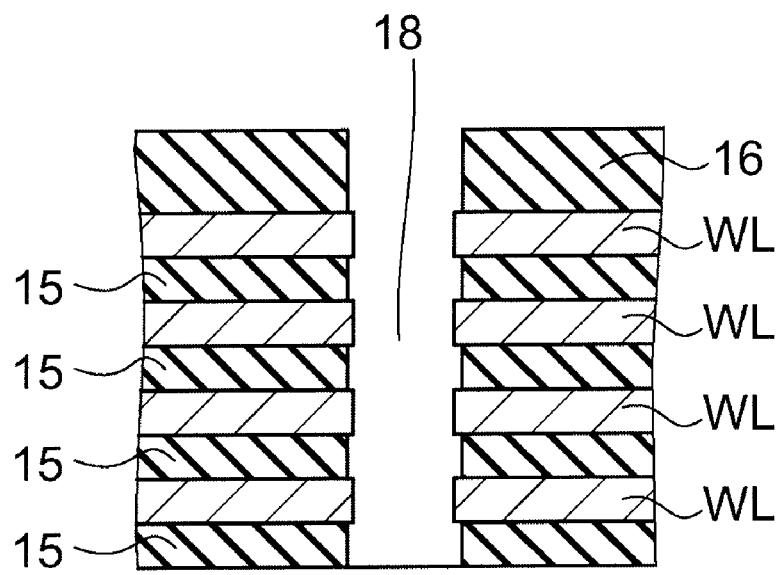

After the aforementioned thermal oxidation, the thermally oxidized portion 32 formed on the inner wall of the memory hole 18 is removed illustratively by wet etching. Thus, the thermally oxidized portion 32 covering the end surface of each electrode layer WL is removed, and as shown in FIG. 6B, the electrode layer WL is exposed into the memory hole 18. Here, the electrode layer WL serves as an etching stopper, whereas the insulating layer 15 between the electrode layers WL is slightly etched because it is made of silicon oxide like the thermally oxidized portion 32. This results in a structure as shown in FIGS. 6B and 2 in which the electrode layers WL are projected from the insulating layers 15 toward the center (radial center) of the memory hole 18. However, in any case, the hole diameter of the portion of the memory hole 18 surrounded by the electrode layer WL is generally equal among the electrode layers WL. It is noted that removal of the thermally oxidized portion 32 is not limited to wet etching, but may be performed by dry etching.

Figure 7A:
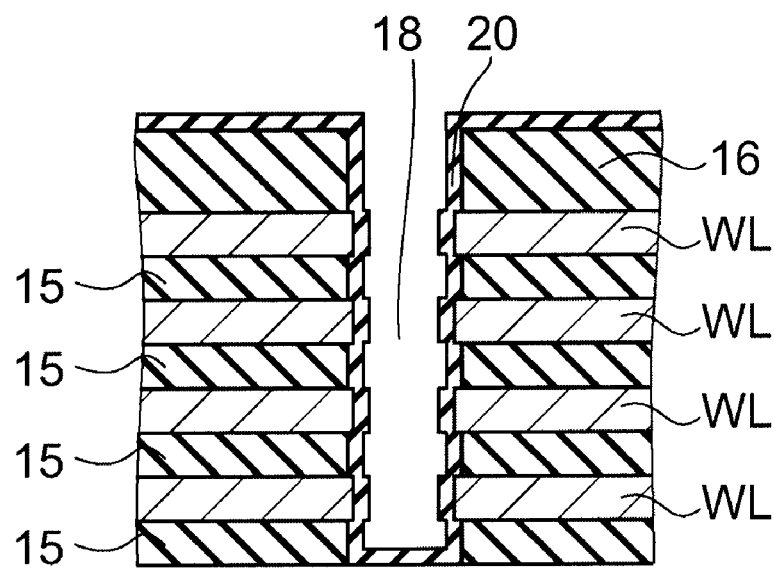

Next, as shown in FIG. 7A, an insulating film 20 having the aforementioned structure shown in FIG. 2 is formed on the inner wall of the memory hole 18 including its sidewall and bottom. Specifically, first, a first insulating film 21 is formed on the inner wall of the memory hole 18. Then, a charge storage layer 22 is formed so as to cover the first insulating film 21. Subsequently, a second insulating film 23 is formed so as to cover the charge storage layer 22.

Figure 7B:
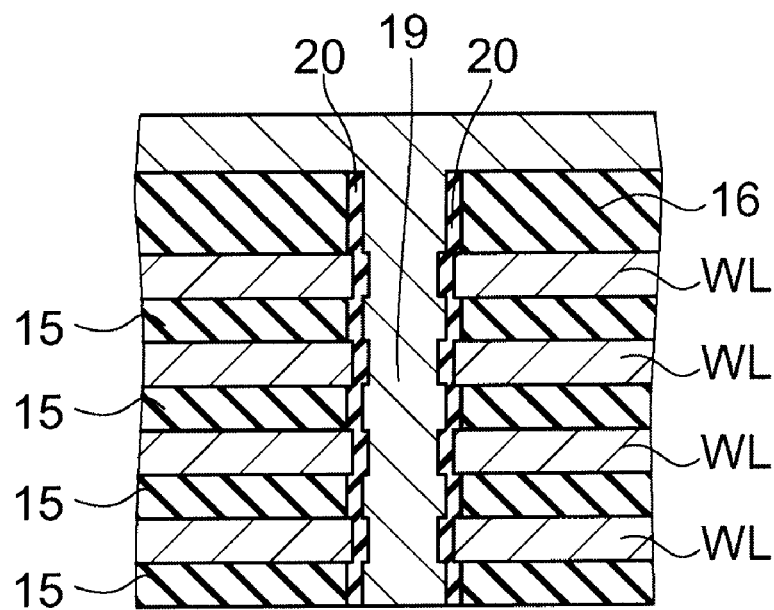

Next, after the insulating film 20 above the insulating layer 16 and at the bottom of the memory hole 18 is removed, as shown in FIG. 7B, silicon is buried in the memory hole 18 to form a silicon body 19. Subsequently, the silicon above the insulating layer 16 is removed, followed by processes for forming drain-side select transistors DST and various interconnects.

As described above, according to this embodiment, the hole diameter of the portion of the memory hole 18 surrounded by the electrode layer WL can be generally equalized among the electrode layers WL. This can prevent the memory cells with each electrode layer WL serving as a control gate from varying in characteristics between the upper-layer side and the lower-layer side, and a semiconductor device with stable quality can be provided.

Furthermore, as described above, etching of silicon oxide is advanced in the radially outward direction of the memory hole 18 using the electrode layer WL as a stopper. This results in the structure as shown in FIG. 2 in which the electrode layers WL are projected from the insulating layers 15 toward the center (radial center) of the memory hole 18. That is, near the boundary between the electrode layer WL and the insulating layer 15, a step difference is formed in the charge storage layer 22. This prevents charge stored in the charge storage layer 22 from diffusing into the charge storage layer 22 of other memory cells. Consequently, the stored charge can be stably retained in each memory cell.

The heat treatment for altering the conductive film 31 into an insulator is not limited to thermal oxidation, but may be thermal nitridation. More specifically, in the case where the conductive film 31 is made of silicon, the conductive film 31 is turned into silicon nitride by thermal nitridation.

If the conductive film 31 is left behind, the electrode layers WL are short-circuited to each other. Hence, thermal oxidation or thermal nitridation needs to be advanced by at least the thickness of the conductive film 31. For silicon, thermally oxidized film is more easily formed thicker than thermally nitridized film. Thus, thermal oxidation is more desirable to alter the entire conductive film 31 into an insulator more rapidly and reliably.

Figure 8:
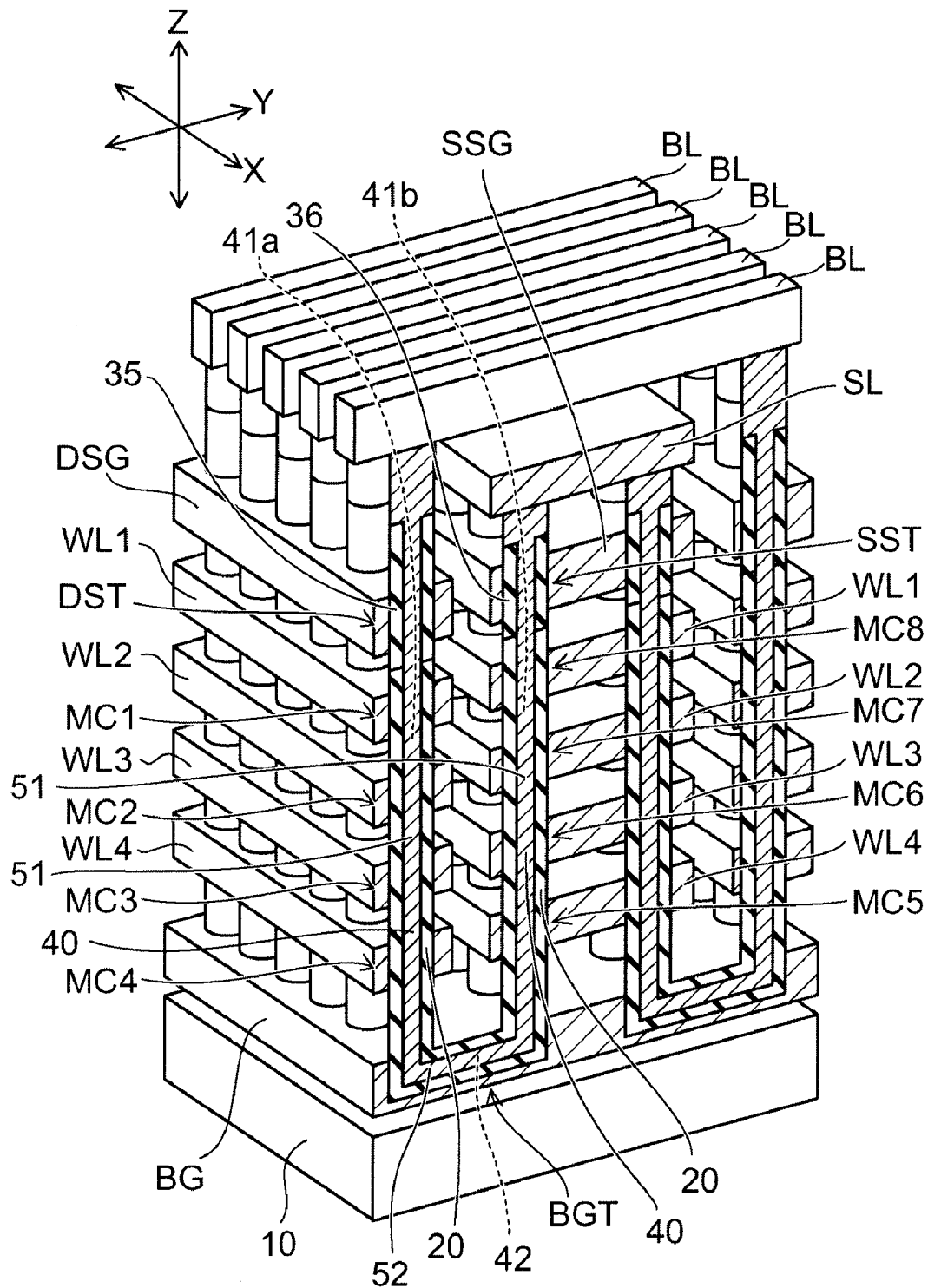
FIG. 8 is a schematic perspective view of a semiconductor device according to another embodiment of the invention.

FIG. 8 is a schematic perspective view showing the configuration of a memory cell array in a semiconductor device according to another embodiment of the invention. In FIG. 8, the insulating portions other than insulating films 20, 35, 36 formed in the hole are not shown. Also in FIG. 8, like FIG. 1, an XYZ orthogonal coordinate system is introduced. A plurality of electrode layers WL1-WL4 are stacked in the Z direction. Each bit line BL extends in the Y direction.

A back gate BG is provided on a substrate 10 via an insulating layer, not shown. The back gate BG is illustratively a silicon layer provided with conductivity by impurity doping. A plurality of electrode layers WL1-WL4 and a plurality of insulating layers, not shown, are alternately stacked on the back gate BG. The number of electrode layers WL1-WL4 is arbitrary, and the case of four layers is illustrated in FIG. 8. The electrode layers WL1-WL4 is illustratively a silicon layer provided with conductivity by impurity doping.

The multilayer body including the electrode layers WL1-WL4 on the back gate BG is divided into a plurality of blocks by trenches extending in the X direction. A drain-side select gate DSG is provided via an insulating layer, not shown, on the uppermost electrode layer WL1 in one block. The drain-side select gate DSG is illustratively a silicon layer provided with conductivity by impurity doping. A source-side select gate SSG is provided via an insulating layer, not shown, on the uppermost electrode layer WL1 in another block neighboring the former block. The source-side select gate SSG is illustratively a silicon layer provided with conductivity by impurity doping.

A source line SL is provided on the source-side select gate SSG via an insulating layer, not shown. The source line SL is illustratively a silicon layer provided with conductivity by impurity doping. Alternatively, the source line SL may be made of a metal material. A plurality of bit lines BL are provided via an insulating layer, not shown, on the source line SL and the drain-side select gate DSG.

A plurality of U-shaped memory holes are formed in the aforementioned multilayer body on the substrate 10. In the block including the drain-side select gate DSG is formed a memory hole 41a extending in the Z direction through the drain-side select gate DSG and the underlying electrode layers WL1-WL4. In the block including the source-side select gate SSG is formed a memory hole 41b extending in the Z direction through the source-side select gate SSG and the underlying electrode layers WL1-WL4. These memory holes 41a, 41b are connected to each other through a memory hole 42 formed in the back gate BG and extending in the Y direction.

A silicon body 40 is provided as a U-shaped semiconductor layer inside the memory holes 41a, 41b, 42. The gate insulating film 35 is formed on the inner wall of the memory hole 41a between the drain-side select gate DSG and the silicon body 40. The gate insulating film 36 is formed on the inner wall of the memory hole 41b between the source-side select gate SSG and the silicon body 40. The insulating film 20 is formed on the inner wall of the memory holes 41a, 41b between each electrode layers WL1-WL4 and the silicon body 40. The insulating film 20 is formed also on the inner wall of the memory hole 42 between the back gate BG and the silicon body 40.

As in the embodiment described above with reference to FIG. 2, the insulating film 20 has the ONO (oxide-nitride-oxide) structure in which a charge storage layer 22 made of silicon nitride film is sandwiched between a first insulating film 21 made of silicon oxide film and a second insulating film 23 made of silicon oxide film.

The silicon body 40 functions as a channel, each electrode layer WL1-WL4 functions as a control gate, and the charge storage layer functions as a data storage layer for storing charge injected from the silicon body 40. That is, at each intersection between the silicon body 40 and the electrode layers WL1-WL4 is formed a memory cell having a structure in which the control gate surrounds the channel.

The gate insulating film 35 is provided between the drain-side select gate DSG and the silicon body 40 penetrating therethrough, and these constitute a drain-side select transistor DST. The upper end portion of the silicon body 40 projected upward from the drain-side select gate DSG is connected to the corresponding bit line BL.

The gate insulating film 36 is provided between the source-side select gate SSG and the silicon body 40 penetrating therethrough, and these constitute a source-side select transistor SST. The upper end portion of the silicon body 40 projected upward from the source-side select gate SSG is connected to the source line SL.

The back gate BG, the silicon body 40 provided in this back gate BG, and the insulating film 20 between the back gate BG and the silicon body 40 constitute a back gate transistor BGT.

A memory cell MC1 with the electrode layer WL1 serving as a control gate, a memory cell MC2 with the electrode layer WL2 serving as a control gate, a memory cell MC3 with the electrode layer WL3 serving as a control gate, and a memory cell MC4 with the electrode layer WL4 serving as a control gate are provided between the drain-side select transistor DST and the back gate transistor BGT.

A memory cell MC5 with the electrode layer WL4 serving as a control gate, a memory cell MC6 with the electrode layer WL3 serving as a control gate, a memory cell MC7 with the electrode layer WL2 serving as a control gate, and a memory cell MC8 with the electrode layer WL1 serving as a control gate are provided between the back gate transistor BGT and the source-side select transistor SST.

The drain-side select transistor DST, the memory cells MC1-MC4, the back gate transistor BGT, the memory cells MC5-MC8, and the source-side select transistor SST are series connected to constitute one memory string. One memory string is formed in a U shape including a pair of pillar portions 51 extending in the Z direction and a link portion 52 connecting the lower end portions of these pillar portions 51. A plurality of such memory strings are arranged in the X and Y direction, and thereby a plurality of memory cells MC1-MC8 are three-dimensionally provided in the X, Y, and Z direction.

The process similar to that in the aforementioned embodiment is also applied to the process for forming the memory holes 41a, 41b in the structure of this embodiment.

Specifically, a recess serving as the memory hole 42 is formed in the back gate BG. Next, after a sacrificial film is buried in the recess, a multilayer body including electrode layers WL1-WL4 is stacked thereon, and memory holes 41a, 41b are formed in the multilayer body.

Next, as in the process of FIG. 5A, a conductive film (such as silicon film) is formed on the inner wall of the memory holes 41a, 41b. Next, as in the process of FIG. 5B, anisotropic etching is performed on the conductive film so that the conductive film is selectively left on the sidewall of the memory holes 41a, 41b. Next, as in the process of FIG. 6A, thermal oxidation is performed to alter the conductive film into an insulator (such as silicon oxide). Next, as in the process of FIG. 6B, the thermal oxide covering the electrode layers WL1-WL4 is removed illustratively by wet etching to expose the electrode layers WL1-WL4 to the sidewall of the memory holes 41a, 41b. Next, after a sacrificial film is buried in the memory holes 41a, 41b, a multilayer body to constitute the drain-side select transistor DST and the source-side select transistor SST is formed thereon, and a hole is formed in the multilayer body immediately above the memory holes 41a, 41b. Then, through that hole, the sacrificial film in the memory holes 41a, 41b and the sacrificial film in the recess (memory hole 42) formed in the back gate BG are removed. Thus, the memory holes 41a, 41b, 42 are connected into a U shape.

Subsequently, an insulating film insulating a charge storage layer is formed on the sidewall of the memory holes 41a, 41b, 42, and then a silicon body is buried in the memory holes 41a, 41b, 42.

Also in this embodiment, by application of the above process, the hole diameter of the portion of the memory holes 41a, 41b, 42 surrounded by the electrode layers WL1-WL4 can be generally equalized among the electrode layers WL1-WL4. This can prevent the memory cells with each electrode layer WL1-WL4 serving as a control gate from varying in characteristics between the upper-layer side and the lower-layer side, and a semiconductor device with stable quality can be provided.

Furthermore, also in this embodiment, the above process is applied to the formation of the memory holes 41a, 41b. This results in a structure in which the electrode layers WL1-WL4 are projected from the insulating layers therebetween toward the center (radial center) of the memory holes 41a, 41b. This prevents charge stored in the charge storage layer from diffusing into the charge storage layer of other memory cells, and the stored charge can be stably retained in each memory cell.

The embodiments of the invention have been described with reference to examples. However, the invention is not limited thereto, but can be variously modified within the spirit of the invention.

The invention is not limited to burying a silicon body in the entire memory hole, but may be based on a structure in which a silicon film is tubularly formed only in the portion in contact with the insulating film including the charge storage layer, and an insulator is buried therein. Furthermore, the insulating film structure between the electrode layer and the silicon body is not limited to the ONO (oxide-nitride-oxide) structure, but can illustratively be a two-layer structure of a charge storage layer and a gate insulating film.

The invention claimed is:

1. A semiconductor device manufacturing method comprising:
    alternately stacking a plurality of insulating layers and electrode layers;
    forming a hole penetrating through a multilayer body of the insulating layers and the electrode layers;
    forming a conductive film on an inner wall of the hole;
    anisotropically etching the conductive film to selectively leave the conductive film on a sidewall of the hole;
    altering the conductive film into an insulator by heat treatment; and
    removing the insulator covering the electrode layers to expose the electrode layers into the hole.

2. The method according to claim 1, wherein the conductive film is altered into the insulator by thermal oxidation.

3. The method according to claim 1, wherein the electrode layers and the conductive film are made of the same material.

4. The method according to claim 3, wherein the electrode layers and the conductive film contain silicon.

5. The method according to claim 1, wherein the insulating layers are silicon oxide layers.

6. The method according to claim 1, wherein the conductive film at bottom of the hole is removed by the anisotropic etching.

7. The method according to claim 1, wherein a thickness of the conductive film left on the sidewall of the hole is relatively thinner on a lower portion of the hole than on an upper portion of the hole.

8. The method according to claim 2, wherein by the heat treatment, oxidation is advanced by at least a thickness of the conductive film.

9. The method according to claim 2, wherein the thermal oxidation is advanced also toward the electrode layers in a portion of the conductive film opposed to the electrode layers.

10. The method according to claim 2, wherein the thermal oxidation forms a thermally oxidized portion expanded in volume into the hole relative to the conductive film.

11. The method according to claim 1, wherein the insulator is removed by etching.

12. The method according to claim 11, wherein in the etching for removing the insulator, the insulating layers are overetched in a direction expanding the hole relative to end surfaces of the electrode layers exposed into the hole.

13. The method according to claim 1, further comprising:
    after exposing the electrode layers into the hole, forming an insulating film including a charge storage layer on the sidewall of the hole; and
    forming a semiconductor layer inside the insulating film in the hole.

14. The method according to claim 13, wherein the forming the insulating film includes:
    forming a first silicon oxide film on the sidewall of the hole;
    forming a silicon nitride film as the charge storage layer inside the first silicon oxide film; and
    forming a second silicon oxide film inside the silicon nitride film.

15. A semiconductor device manufacturing method comprising:
- forming a recess in a conductive layer;
- burying a sacrificial film in the recess;
- alternately stacking a plurality of insulating layers and electrode layers on the conductive layer having the sacrificial film buried therein;
- forming a hole penetrating through a multilayer body of the insulating layers and the electrode layers;
- forming a conductive film on an inner wall of the hole;
- anisotropically etching the conductive film to selectively leave the conductive film on a sidewall of the hole;
- altering the conductive film into an insulator by heat treatment;
- removing the insulator covering the electrode layers to expose the electrode layers into the hole; and
- removing the sacrificial film in the recess through the hole to connect the hole exposing the electrode layers to the recess.

* * * * *